United States Patent
Kwon

(10) Patent No.: US 11,904,390 B2
(45) Date of Patent: Feb. 20, 2024

(54) METHOD FOR MANUFACTURING ELECTROSTATIC CHUCK HAVING ELECTRODE LAYER INCLUDING CLAD MEMBER AND ELECTROSTATIC CHUCK MANUFACTURED THEREBY

(71) Applicant: PUKYONG NATIONAL UNIVERSITY INDUSTRY—UNIVERSITY COOPERATION FOUNDATION, Busan (KR)

(72) Inventor: Hansang Kwon, Busan (KR)

(73) Assignee: Pukyong National University Industry-University Cooperation Foundation, Busan (KR)

( * ) Notice: Subject to any disclaimer, the term of this patent is extended or adjusted under 35 U.S.C. 154(b) by 0 days.

(21) Appl. No.: 17/733,007

(22) Filed: Apr. 29, 2022

(65) Prior Publication Data
US 2022/0355374 A1  Nov. 10, 2022

(30) Foreign Application Priority Data
May 10, 2021 (KR) .......................... 10-2021-0060214

(51) Int. Cl.
*B22F 3/20* (2006.01)
*C23C 4/11* (2016.01)
(Continued)

(52) U.S. Cl.
CPC .................. *B22F 3/20* (2013.01); *B22F 3/24* (2013.01); *B22F 9/04* (2013.01); *C22C 38/105* (2013.01);
(Continued)

(58) Field of Classification Search
CPC .. B22F 3/20; B22F 2301/052; B22F 2302/40; C22C 38/105; C23C 4/11; C23C 4/134; H01L 21/6833
See application file for complete search history.

(56) References Cited

U.S. PATENT DOCUMENTS 6,122,159 A     9/2000 Arai et al.
10,196,757 B1 *  2/2019 Chen .................... D01D 5/0061
(Continued)

FOREIGN PATENT DOCUMENTS

DE  102012210023 A1 * 12/2013 ............. G01L 19/04
JP         11-168134 A     6/1999
(Continued)

OTHER PUBLICATIONS

Kim, Dasom, et al. "Carbon nanotubes-reinforced aluminum alloy functionally graded materials fabricated by powder extrusion process." Materials Science and Engineering: A 745 (2019): 379-389 (Year: 2019).*

(Continued)

*Primary Examiner* — Sally A Merkling
*Assistant Examiner* — Sean P. O'Keefe
(74) *Attorney, Agent, or Firm* — Knobbe, Martens, Olson & Bear, LLP

(57) ABSTRACT

This application relates to a method of manufacturing an electrostatic chuck having a high heat dissipation property and high thermal shock resistance and being lightweight, and an electrostatic chuck manufactured by the method. In one aspect, the method includes preparing a composite powder by milling (i) aluminum or aluminum alloy powder and (ii) carbon-based nanomaterial powder through ball milling. The method may also include manufacturing a multilayer billet including a core layer and one or more shell layers surrounding the core layer, in which at least one of the (Continued)

core and shell layers contains the composite powder. The method may further include extruding the multilayer billet to form an electrode layer and forming a dielectric layer on the electrode layer.

14 Claims, 9 Drawing Sheets

(51) Int. Cl.
  *C23C 4/134* (2016.01)
  *B22F 3/24* (2006.01)
  *C22C 38/10* (2006.01)
  *B22F 9/04* (2006.01)
  *H01L 21/683* (2006.01)

(52) U.S. Cl.
  CPC ............... *C23C 4/11* (2016.01); *C23C 4/134* (2016.01); *H01L 21/6833* (2013.01); *B22F 2003/242* (2013.01); *B22F 2009/043* (2013.01); *B22F 2301/052* (2013.01); *B22F 2302/40* (2013.01)

(56) References Cited

U.S. PATENT DOCUMENTS

| | | | |
|---|---|---|---|
| 2013/0059074 A1 | 3/2013 | Xu et al. | |
| 2016/0336210 A1* | 11/2016 | Cooke | H01L 21/67248 |
| 2018/0126456 A1 | 5/2018 | So et al. | |
| 2019/0276915 A1 | 9/2019 | Kwon | |

FOREIGN PATENT DOCUMENTS

| | | | | |
|---|---|---|---|---|
| KR | 10-1999-0062932 A | 7/1999 | | |
| KR | 10-2012-0078270 A | 7/2012 | | |
| KR | 10-2014-0119904 A | 10/2014 | | |
| KR | 2014119904 A | * 10/2014 | | |
| KR | 1769750 B1 | * 8/2017 | ............... | C23C 4/11 |
| KR | 1822073 B1 | * 1/2018 | ........... | B21C 23/001 |
| KR | 2018005972 A | * 1/2018 | ............. | H01B 1/023 |
| KR | 10-2096985 B1 | 4/2020 | | |
| KR | 10-2020-0046233 A | 5/2020 | | |
| KR | 10-2020-0121627 A | 10/2020 | | |

OTHER PUBLICATIONS

Office Action received in Korean Application No. KR 10-2021-0060214 dated Oct. 29, 2022.
Notice of Allowance received in Korean Application No. KR 10-2021-0060214 dated May 24, 2023.
Office Action received in Korean Application No. KR 10-2021-0060215 dated Oct. 30, 2022.
Notice of Allowance received in Korean Application No. KR 10-2021-0060215 dated Apr. 5, 2023.

* cited by examiner

Aluminum (or aluminum alloy)-carbon-based nanomaterial (CNT, graphene, etc.) composite material layer Aluminum (or aluminum alloy)-carbon-based nanomaterial (CNT, graphene, etc.) composite material core

METHOD FOR MANUFACTURING ELECTROSTATIC CHUCK HAVING ELECTRODE LAYER INCLUDING CLAD MEMBER AND ELECTROSTATIC CHUCK MANUFACTURED THEREBY

CROSS REFERENCE TO RELATED APPLICATION

The present application claims priority to Korean Patent Application No. 10-2021-0060214, filed May 10, 2021, the entire contents of which is incorporated herein for all purposes by this reference.

BACKGROUND

Technical Field

The present disclosure relates to a method of manufacturing an electrostatic chuck and to an electrostatic chuck manufactured by the method. More particularly, the present disclosure relates to a method of manufacturing an electrostatic chuck having excellent characteristics in heat dissipation, thermal shock resistance, and lightness due to the structure in which an electrode layer is made of a specific clad member, and to an electrostatic chuck manufactured by the method.

Description of Related Technology

In the process of manufacturing semiconductor devices and display devices for which enlargement of substrates and higher integration of circuits are the main issues, a mechanical chuck or a vacuum chuck has been used to transport or fix a silicon wafer or a glass substrate.

The mechanical chuck has problems in that it has a complicated structure, requires time for maintenance and inspection, and suffers particle contamination due to the contact between a wafer and a clamp. In the case of a vacuum chuck, there is an inconvenience of creating a vacuum pressure leading to a weak adsorption force because the pressure difference cannot be sufficiently increased in the vacuum pressure condition. On the other hand, recently, electrostatic chucks (ESC) using electrostatic force have been widely used.

SUMMARY

An objective to be achieved by the present disclosure is to provide a method of manufacturing an electrostatic chuck having good durability even in a harsh environment where heating and cooling cycles are repeated, having a high heat dissipation property and high thermal shock resistance, and being lightweight, thereby being capable of dramatically improving the efficiency of production of semiconductor devices. Another objective is to provide an electrostatic chuck manufactured by the method.

In order to accomplish the objectives, there is proposed a method of manufacturing an electrostatic chuck having a high heat dissipation property high thermal shock resistance and being lightweight, the method including: (A) preparing a composite powder by milling (i) aluminum or aluminum alloy powder and (ii) carbon-based nanomaterial powder through ball milling; (B) manufacturing a multilayer billet including a core layer and one or more shell layers surrounding the core layer, wherein at least one of the core and shell layers comprises the composite powder; (C) extruding the billet to prepare an electrode layer; and (D) forming a dielectric layer on the electrode layer.

In addition, the present disclosure proposes a method of manufacturing an electrostatic chuck having a high heat dissipation property and high thermal shock resistance and being lightweight, in which the carbon-based nanomaterial may include at least one selected from the group consisting of carbon nanotubes, graphene, carbon nanofibers, carbon nanoparticles, mesoporous carbon, carbon nanosheets, carbon nanorods, and carbon nanobelts.

In addition, the present disclosure proposes a method of manufacturing an electrostatic chuck having a high heat dissipation property and high thermal shock resistance and being lightweight, in which the multilayer billet may include a core layer and at least two shell layers surrounding the core layer. Here, the core layer and the shell layers except for the outermost shell layer are made of the composite powder, and the outermost shell layer is made of (i) the aluminum or aluminum alloy powder or (ii) the composite powder. The composite powders contained in the core and shell layers, respectively, differ in a ratio of the parts by volume of the carbon nanotubes with respect to the parts by volume of the aluminum or aluminum alloy powder.

In addition, the present disclosure proposes a method of manufacturing an electrostatic chuck having a high heat dissipation property and high thermal shock resistance and being lightweight, in which the multilayer billet may include: a can-shaped first billet serving as the second shell layer, a second billet disposed inside the first billet and serving as the first shell layer, and a third billet disposed inside the second billet and serving as the core layer.

In addition, the present disclosure proposes a method of manufacturing an electrostatic chuck having a high heat dissipation property and high thermal shock resistance and being lightweight, in which in step (C), the multilayer billet may be directly extruded using extrusion dies to produce the electrode layer.

In addition, the present disclosure proposes a method of manufacturing an electrostatic chuck having a high heat dissipation property and high thermal shock resistance and being lightweight, in which in step (D), the dielectric layer made of $Al_2O_3$, $ZrO_3$, $AlN$, or $Y_2O_3$ may be formed by thermal spraying.

In addition, the present disclosure proposes a method of manufacturing an electrostatic chuck having a high heat dissipation property and high thermal shock resistance and being lightweight, in which the thermal spraying may be air plasma spraying (APS), vacuum plasma spraying (VPS), or low pressure plasma spraying (LPPS).

In addition, the present disclosure proposes a method of manufacturing an electrostatic chuck having a high heat dissipation property and high thermal shock resistance and being lightweight, in which step (D) may include a step of forming a metal alloy layer including 1% to 5% by weight of cobalt (Co), 10% to 20% by weight of nickel (Ni), and 75% to 85% by weight of iron (Fe), prior to the formation of the dielectric layer on the electrode layer.

In another aspect of the present disclosure, there is provided an electrostatic chuck made by any one of the methods described above.

According to the present disclosure, it is possible to prepare a constituent member for an electrostatic chuck, for example, an electrode layer through a simpler process than the conventional process, thereby providing the advantage of obtaining both the equipment performance and the price competitiveness at the same time. The electrostatic chuck manufactured by the method of the present disclosure has good durability even in a harsh application condition in which heating and cooling are repeated and can dramatically improve the efficiency of the semiconductor production process.

BRIEF DESCRIPTION OF THE DRAWINGS

FIGS. 4A through 4C illustrate an example of a clad member constituting an electrode layer included in an electrostatic chuck according to the present disclosure, in which an outer layer (also called a second shell layer) and an inner layer (also called a core layer) are made of aluminum or aluminum alloy and an intermediate layer is made of a clad member made of a composite material of aluminum (or aluminum alloy)/carbon-based nanomaterial (for example, CNT, graphene, etc.), in which FIG. 4A is a longitudinal cross-sectional view, FIG. 4B is a longitudinal side elevation view, and FIG. 4C is a perspective view.

FIGS. 5A through 5C illustrate another example of a clad member constituting an electrode layer included in an electrostatic chuck according to the present disclosure, in which an outer layer (also called a second shell layer) is made of aluminum or aluminum alloy and an inner layer (also called a core layer) is made of a composite material of and an intermediate layer is made of a clad member made of a composite material of aluminum (or aluminum alloy)/carbon-based nanomaterial (for example, CNT, graphene, etc.), in which FIG. 5A is a longitudinal cross-sectional view, FIG. 5B is a longitudinal side elevation view, and FIG. 5C is a perspective view.

DETAILED DESCRIPTION

Figure 1:
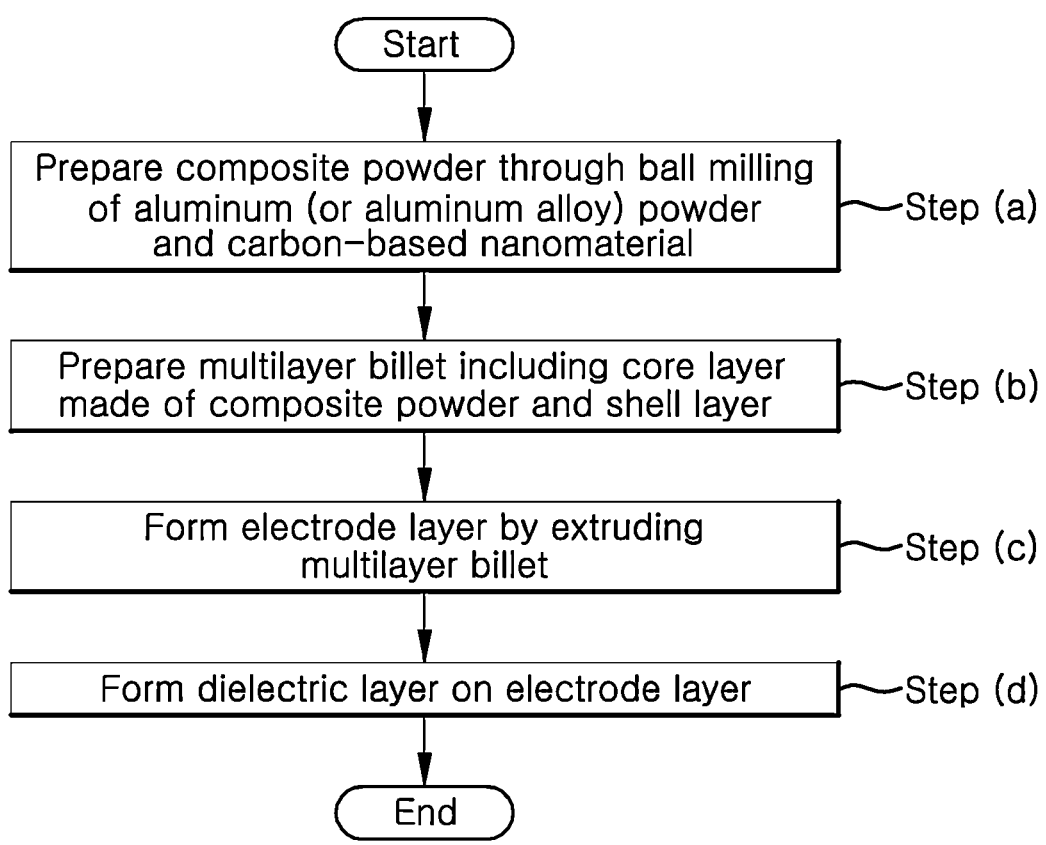
FIG. 1 is a process flowchart illustrating a method of manufacturing an electrostatic chuck according to the present disclosure.

Among metals used to manufacture the electrostatic chucks, aluminum or aluminum alloy is most common due to the advantage of relatively low manufacturing cost compared to sintered ceramic materials. However, when tunable electrostatic chucks (ESCs) are used at elevated temperatures higher than room temperature and undergo repeated heating and cooling cycles, these ESCs have a problem in that the thermal expansion coefficient thereof, which is the most important factor, is $10 \times 10^{-6} K^{-1}$ or more which is very high compared to that of sintered ceramics or coatings.

Therefore, in the related art, due to the difference in the coefficient of thermal expansion between a base member made of metal and a ceramic dielectric layer formed on the base material, there was a problem in that the ceramic dielectric layer was peeled or cracked at the interface between the base member and the dielectric layer. This is because thermal stress occurs due to the difference in thermal expansion coefficient between the metal base member and the ceramic dielectric layer while heating and cooling are repeated.

Due to the peeling or cracking of the ceramic dielectric layer, the service life of the electrostatic chuck is shortened. This short service life of the electrostatic chuck results in frequent replacements to new electrostatic chucks, leading to an increase in the cost and an increase in time for the manufacturing process.

When the electrode of the electrostatic chuck is made of a material having higher thermal conductivity than the existing material for the electrostatic chuck, the semiconductor manufacturing speed can be increased due to rapid heat dissipation, which leads to the manufacture of semiconductors with high price competitiveness.

In describing the present disclosure, well-known functions or constructions will not be described in detail when it is determined that they may obscure the gist of the present disclosure.

Since embodiments in accordance with the concept of the present disclosure can undergo various changes and have various forms, only some specific embodiments are illustrated in the drawings and described in detail in the present specification. While specific embodiments of the present disclosure are described herein below, they are only for illustrative purposes and should not be construed as limiting to the present disclosure. Thus, the present disclosure should be construed to cover not only the specific embodiments but also cover all modifications, equivalents, and substitutions that fall within the concept and technical spirit of the present disclosure.

The terminology used herein is for the purpose of describing particular embodiments only and is not intended to limit the scope of the present disclosure. As used herein, the singular forms "a", "an", and "the" are intended to include the plural forms as well unless the context clearly indicates otherwise. It will be further understood that the terms "comprise" or "has" when used in the present specification specify the presence of stated features, regions, integers, steps, operations, elements and/or components, but do not preclude the presence or addition of one or more other features, regions, integers, steps, operations, elements, components and/or combinations thereof.

Hereinafter, embodiments of the present disclosure will be described in detail.

A method of manufacturing an electrostatic chuck including a clad electrode layer, according to one embodiment of the present disclosure, includes: (A) preparing a composite powder by milling (i) aluminum or aluminum alloy powder and (ii) carbon-based nanomaterial powder through ball milling; (B) manufacturing a multilayer billet including a core layer and one or more shell layers surrounding the core layer, in which at least one of the core and shell layers includes the composite powder; (C) extruding the multilayer billet to prepare an electrode layer; and (D) forming a dielectric layer on the electrode layer.

In step (A), the aluminum powder or aluminum alloy powder is the powder of any one selected from the group consisting of 1000 series, 2000 series, 3000 series, 4000 series, 5000 series, 6000 series, 7000 series, and 8000 series.

The carbon-based nanomaterial is at least one selected from the group consisting of carbon nanotubes, graphene, carbon nanofibers, carbon nanoparticles, mesoporous carbon, carbon nanosheets, carbon nanorods, and carbon nanobelts. The carbon-based nanomaterial may be added in an amount of 0.1% to 10% by volume with respect to the total volume of the composite powder.

Since the composite powder includes the carbon-based material such as carbon nanotubes, graphene, etc., the composite material manufactured from the billet including the same may have high thermal conductivity, high strength, and weight reduction characteristics.

Micro-sized aluminum alloy particles are difficult to disperse due to a large size difference from the nano-sized carbon-based nanomaterial, and the carbon-based nanomaterial easily agglomerates due to a strong Van der Waals force. Therefore, a dispersion agent is added to uniformly blend the carbon-based nanomaterial and the aluminum alloy powder.

As the dispersion agent, nanoparticles of a ceramic material selected from the group consisting of SiC, $SiO_2$, $Al_2O_3$, $TiO_2$, $Fe_3O_4$, MgO, $ZrO_2$, and various mixtures of these.

The nano-sized ceramic particles function to uniformly disperse the carbon-based material such as carbon nanotubes among the aluminum alloy particles. The nano-sized silicon carbide (SiC) particles have high tensile strength, high sharpness, constant electrical conductivity, constant thermal conductivity, high hardness, and high resistance to chemicals and thermal shock. Since the nano-sized SiC particles are highly stable at high temperatures and under chemicals, they are widely used as a material for an abrasive or a fireproofing material. In addition, the nano-sized SiC particles present on the surfaces of the aluminum alloy particles function to prevent direct contact between the carbon-based nanomaterial such as carbon nanotubes and the aluminum alloy particles, thereby inhibiting the formation of undesirable aluminum carbide which may be formed through a reaction between the carbon-based nanomaterial such as carbon nanotubes and the aluminum alloy particles.

In addition, the composite powder may include 100 parts by volume of the aluminum alloy powder and 0.01 to 10 parts by volume of the carbon-based nanomaterial.

When the content of the carbon-based nanomaterial is less than 0.01 part by volume per 100 parts by volume of the aluminum alloy powder, the strength of the composite material is similar to that of pure aluminum or aluminum alloy. In this case, the composite material cannot play a role as a reinforcing material. Conversely, when the content of the carbon-based nanomaterial exceeds 10 parts by volume, there is a disadvantage in that an elongation decreases although the strength of the composite material is higher than that of pure aluminum or aluminum alloy. In addition, when the content of the carbon nanotubes is extremely large, since the carbon nanotubes are difficult to disperse, mechanical and physical properties are degraded.

When the composite powder further includes the dispersion agent, the composite powder contains 0.1 to 10 parts by volume of the dispersion agent per 100 parts by volume of the aluminum alloy powder.

When the content of the dispersion agent is lower than 0.1 part by volume per 100 parts by volume of the aluminum alloy powder, the effect of improving dispersion is insignificant. Conversely, when the content exceeds 10 parts by volume, the dispersion agent rather causes the carbon-based nanomaterial to agglomerate, thereby hindering dispersion of the carbon-based nanomaterial.

The ball milling is performed in an air or inert gas ambient (for example, nitrogen or argon ambient) at a low speed of 150 to 300 rpm or a high speed of 300 or more rpm for a duration of 12 to 48 hours, using a ball mill. For example, a horizontal ball mill or a planetary ball mill is used for the ball milling.

The ball milling begins by charging 100 to 1500 parts by volume of stainless steel balls (a 1:1 mixture of balls with a diameter of 10 mm and balls with a diameter of 20 mm) into a stainless steel container with respect to 100 parts by volume of the composite powder.

To reduce the coefficient of friction, any one organic solvent selected from the group consisting of heptane, hexane, and alcohol is used as a process control agent. In this case, the process control agent is added in an amount of 10 to 50 parts by volume per 100 parts by volume of the composite powder. After the completion of the ball milling, the ball mill container is opened so that the organic solvent can volatilize when the powder mixture is collected. Thus, only the aluminum alloy powder and the carbon nanotubes remain in the powder mixture.

The nano-zed ceramic particles serving as the dispersion agent also play the same role as nano-sized milling balls due to the rotational force generated during the ball milling, thereby physically separating the agglomerated carbon-based nanomaterial, and improving the fluidity of the carbon-based nanomaterial. Thus, the carbon-based nanomaterial can be uniformly dispersed on the surfaces of the aluminum particles.

Next, in step (B), a multilayer billet including the composite powder obtained in the previous step is prepared.

The multilayer billet prepared in this step is composed of a core layer and a shell layer surrounding the core layer. Alternatively, the multilayer billet includes a core layer and two or more shell layers surrounding the core layer. The core layer is made from the composite powder or from aluminum alloy powder, the shell layers except for the outermost shell layer are made from the composite powder, and the outermost shell layer is made from aluminum alloy.

When the number of shell layers except for the outermost shell layer is two or more, the respective composite powders included in two or more shell layers differ in ratio of components thereof. That is, the respective composite powders differ in volume ratio of aluminum alloy powder and carbon-based nanomaterial.

In addition, when the core layer is made from the composite powder, the respective composite powders included in the shell layers except for the core layer and the outermost shell layer differ in composition. That is, the respective composite powders differ in volume ratio of aluminum alloy powder and carbon-based nanomaterial.

The number of the shell layers included in the multilayer billet is not particularly limited, but it is preferably 5 or less in terms of cost efficiency.

Figure 2:
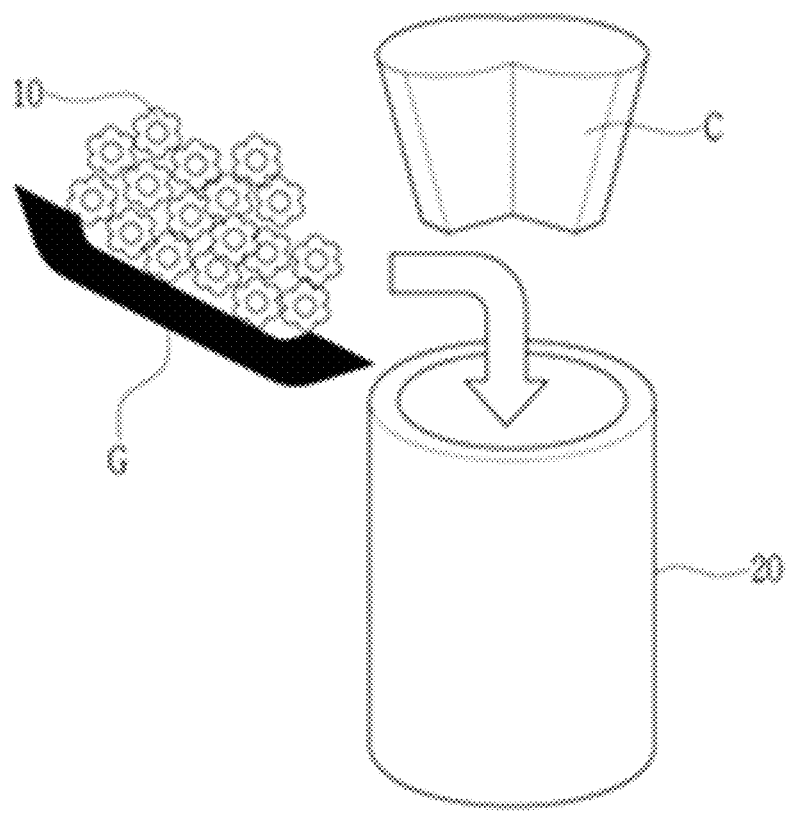
FIG. 2 is a schematic diagram illustrating a process of preparing a multilayer billet used for the formation of an electrode layer included in an electrostatic chuck according to the present disclosure.

FIG. 2 is a diagram schematically illustrating an example of a multilayer billet preparation process.

Referring to FIG. 2, the billet is prepared by charging the composite powder 10 into a metal can 20 through a guider G and sealing the metal can 20 with caps C so that the composite power cannot flow out of the metal can 20.

The metal can 20 may be made of any metal being thermally and electrically conductive. Preferably, the metal can 20 is made of aluminum, aluminum alloy, copper, or magnesium. The thickness of the metal can 20 ranges from 0.5 mm to 150 mm when the billet has a 6-inch size. The thickness varies depending on the size of the billet used.

Figure 3:
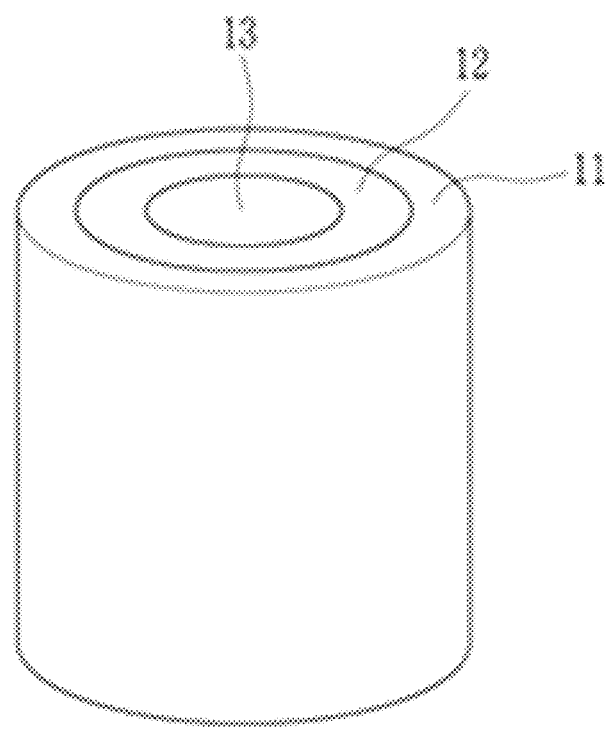
FIG. 3 is a schematic diagram illustrating an example of the multilayer billet used for the formation of an electrode layer included in an electrostatic chuck according to the present disclosure.

FIG. 3 is a diagram illustrating an exemplary multilayer billet that can be prepared in this step. The exemplary multilayer billet includes a core layer and two shell layers surrounding the core layer. Specifically, the multilayer billet includes a core layer, a first shell layer surrounding the core layer, and a second shell layer surrounding the first shell layer.

Referring to FIG. 3, a first billet 11 having an empty cylinder shape and serving as a second shell layer is prepared. A second billet 12 serving as a first shell layer and having a different composition from the first billet 11 is disposed inside the first billet 11. A third billet 13 serving as a core layer and having a different composition from the second billet 12 is disposed inside the second billet 12. Thus, a multilayer billet can be prepared in this way.

The first billet 11 has a hollow cylindrical shape. The first billet 11 may be in the form of a can that is closed at one end and is open at the other end. Alternatively, the first billet 11 is in the form of a hollow cylinder being open at both ends. The first billet 11 may be made from aluminum, copper, magnesium, or the like. The first billet 11 having a hollow cylinder shape is manufactured by melting a base metal and injecting the molten metal into a mold. Alternatively, the first billet 11 may be manufactured by machining a metal block.

The second billet 12 may include the prepared composite powder. The second billet 12 may be in the form of a bulk body or in the form of powder.

When the second billet 12 is in the form of a bulk body, the shape of the second billet 12 may be specifically a circular column shape. The multilayer billet is prepared by inserting the second billet 12 having a circular column shape into the first billet 11. The method of inserting the second billet 12 into the first billet 11 may include: a step of preparing the second billet having a circular column shape by melting and pouring the composite powder into a mold; and press-fitting the second billet 12 into the first billet 11. Alternatively, the insertion of the second billet 12 into the first billet 11 may be performed by directly charging the composite powder into the cavity of the first billet 11.

The third billet 13 may be in the form of a bulk metal body or a metal powder.

When the second billet 12 or the third billet 13 is in the form of a bulk body including the composite powder, the second billet 12 may be prepared by compressing the composite powder at a high pressure or by sintering the composite powder.

In this case, the respective composite powders included in the second billet 12 and the third billet 13 have different compositions. When each of the composite powders is composed of two different materials which are respectively aluminum (or aluminum alloy) powder and carbon nanotubes (CNT), the composite powder of the second billet 12 contains 0.09 to 10 parts by volume of the carbon nanotubes per 100 parts by volume of the aluminum or aluminum alloy powder, and the composite powder of the third billet 13 contains the carbon nanotubes in an amount larger than 0 part by volume and not greater than 0.08 parts by volume per 100 parts by volume of the aluminum alloy powder.

Alternatively, the second billet 12 includes the composite powder, and the third billet 13 may be a bulk body or powder of any one selected from the group consisting of aluminum, copper, magnesium, titanium, stainless steel, tungsten, cobalt, nickel, tin, and alloys of these.

Of the total volume of the multilayer billet, the second billet 12 accounts for 0.01% to 10% by volume, the third billet 13 accounts for 0.01% to 10% by volume, and the first billet 11 accounts for the remaining volume percent.

On the other hand, since the multilayer billet includes the second or third billet 12 or 13 including the composite powder, the multilayer billet may be compressed at a high pressure of 10 to 100 MPa before being enclosed.

Since the multilayer billet is compressed, the multilayer billet can be extruded using an extrusion die in the next step. When the pressure to compress the composite powder is less than 10 MPa, pores are likely to occur in the produced composite powder having undergone plastic working, and the composite powder is likely to flow down. When the pressure exceeds 100 MPa, the second billet (i.e., second and higher-numbered billets) is likely to expand due to the high pressure.

In addition, since the multilayer billet includes the second billet including the composite powder and/or the third billet, a process of sintering the multilayer billet is performed to supply the multilayer billet to plastic working such as extrusion.

A spark plasma sintering apparatus or a hot press sintering apparatus may be used for the sintering. However, any sintering apparatus can be used if the same objective can be achieved. However, when it is necessary to precisely sinter the multilayer billet in a short time, it is preferable to use discharge plasma sintering. In this case, the discharge plasma sintering is performed at a temperature of in the range of 280° C. to 600° C. at a pressure in the range of 30 to 100 MP for a duration of 1 second to 30 minutes.

Next, in step (C), the billet prepared in the previous step is directly extruded using an extrusion die to prepare a clad member, and the clad member is processed to form an electrode layer.

The extrusion dies may be a solid dies, a hollow dies, or a semi-hollow dies.

In the direct extrusion, the die temperature may be 400° C. to 550° C., the extrusion ratio may be 15 to 120, the extrusion rate may be 2 mm/s to 10 mm/s, and the extrusion pressure may be 150 kg/cm$^2$ to 200 kg/cm$^2$, and the billet temperature may be 350° C. to 550° C. The extrusion ratio is a ratio of the cross-sectional area of the billet and the cross-sectional area of the clad member.

On the other hand, when the multilayer billet includes the second billet containing the composite powder and/or the third billet (i.e. third or higher-number billets), it is necessary to compress or sinter the multilayer billet at a high pressure as described above to directly extrude the multilayer billet using the extrusion dies.

Figure 4A:
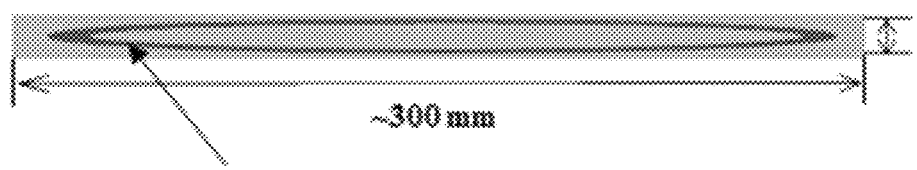
Figure 4B:
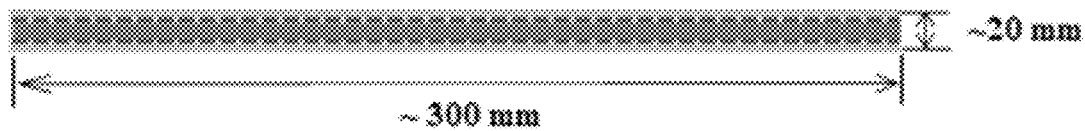
Figure 4C:
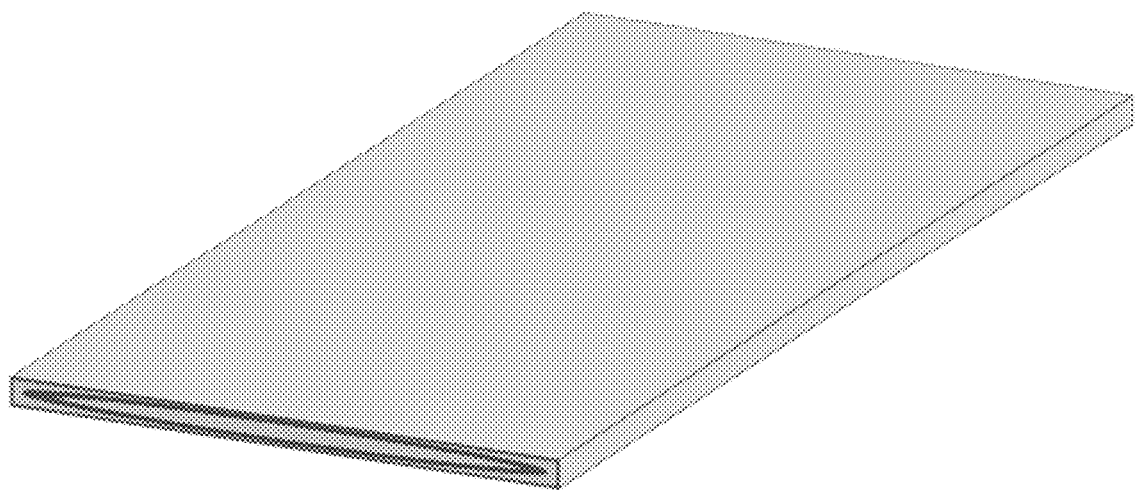

FIGS. 4A through 4C illustrate an example of a clad member constituting an electrode layer included prepared in this step, in which an outer layer (also called a second shell layer) and an inner layer (also called a core layer) are made of aluminum or aluminum alloy and an intermediate layer is made of a clad member made of a composite material of aluminum (or aluminum alloy)/carbon-based nanomaterial (for example, CNT, graphene, etc.). FIG. 4A is a longitudinal cross-sectional view, FIG. 4B is a longitudinal side elevation view, and FIG. 4C is a perspective view.

In the case of the clad member of FIG. 4, a multilayer billet is prepared such that a third billet having a circular column shape and made of aluminum or aluminum alloy is disposed inside a first billet made of aluminum or aluminum alloy and having a cylinder shape, and a second billet including the composite powder is disposed between the first billet and the third billet. The multilayer billet is then compressed and sintered, and then directly extruded.

Figure 5A:
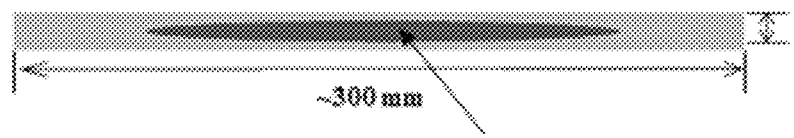
Figure 5B:
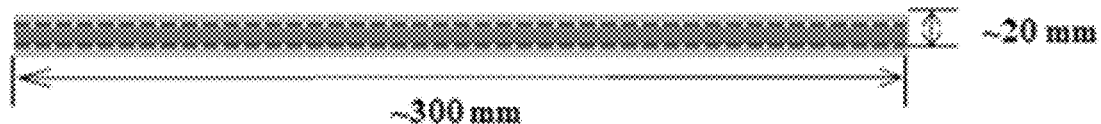
Figure 5C:
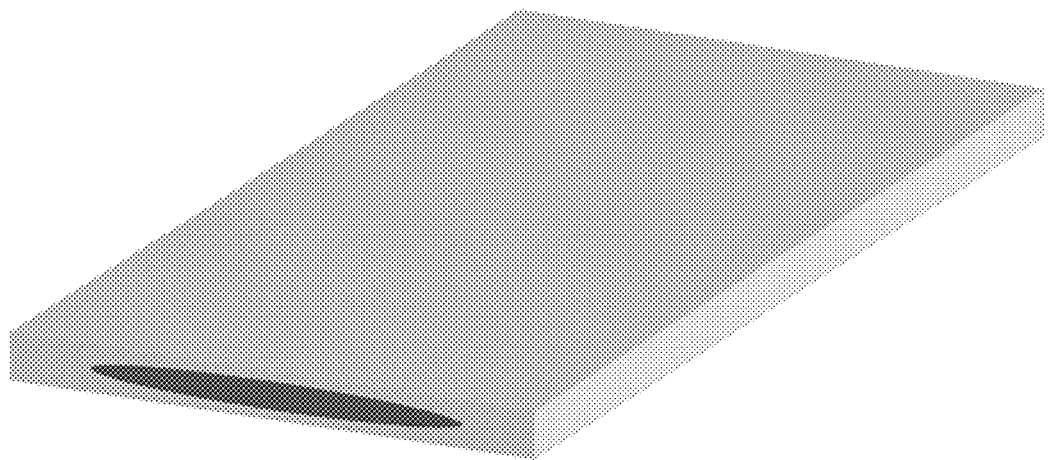

FIGS. 5A through 5C illustrate another example of a clad member constituting an electrode layer included in an electrostatic chuck according to the present disclosure, in which an outer layer (also called a second shell layer) is made of aluminum or aluminum alloy and an inner layer (also called a core layer) is made of a composite material of and an intermediate layer is made of a clad member made of a composite material of aluminum (or aluminum alloy)/carbon-based nanomaterial (for example, CNT, graphene, etc.). FIG. 5A is a longitudinal cross-sectional view, FIG. 5B is a longitudinal side elevation view, and FIG. 5C is a perspective view.

In the case of the clad member of FIG. 5, a multilayer billet is prepared such that a second billet including the composite power is disposed in a first billet having a cylinder shape and made of aluminum or aluminum alloy, and the multilayer billet is compressed or sintered. Next, the multilayer billet undergoes direct extrusion.

Next, in step (D), a dielectric layer is formed on the electrode layer to manufacture an electrostatic chuck having a structure in which the electrode layer and the dielectric layer are stacked in order.

As a specific method of forming the dielectric layer on the electrode layer in this step, a conventional coating layer forming method such as physical vapor deposition (PVD) and chemical vapor deposition (CVD) may be used. However, in terms of the productivity of the dielectric layer and stability, this step is performed by thermal spraying.

More preferably, plasma spraying that uses plasma as a heat source may be used to melt, accelerate, and coat dielectric material powder. Specific examples thereof include air plasma spraying (APS), vacuum plasma spraying (VPS), low pressure plasma spraying (LPPS), etc.

In addition, prior to the formation of the dielectric layer on the electrode layer, a step of forming a metal layer made of metal alloy including 1% to 5% by weight of cobalt (Co), 10% to 20% by weight of nickel (Ni), and 75% to 85% by weight of iron (Fe) may be performed.

The alloy having the composition described above has a little difference in coefficient of thermal expansion from the material constituting the dielectric layer. Therefore, even though the electrostatic chuck is used in a semiconductor manufacturing apparatus in which heating and cooling are repeated, the dielectric breakdown attributable to thermal shock is reduced. Since the alloy has good thermal resistance, it is possible to obtain an electrostatic chuck exhibiting excellent insulation properties and reliability.

As a method of forming the dielectric layer on the electrode layer, a conventional coating layer forming method such as physical vapor deposition (PVD) or chemical vapor deposition (CVD) may be can be used. However, in terms of the productivity and stability, thermal spraying may be preferably used.

More preferably, plasma spraying which uses plasma as a heat source may be used to melt, accelerate, and coat dielectric material powder. Specific examples thereof include air plasma spraying (APS), vacuum plasma spraying (VPS), low pressure plasma spraying (LPPS), etc.

On the other hand, surface treatment may be performed on the electrode layer to improve the bonding force between the electrode layer and the dielectric layer through a known surface treatment method, if necessary, before the step of forming the dielectric layer. For example, when the dielectric layer is formed by thermal spraying, the surface of the electrode layer may be roughened by blasting so that the bonding force between the electrode layer and the dielectric layer can be improved.

With the use of the electrostatic chuck manufacturing method of the present disclosure, it is possible to prepare a constituent member for an electrostatic chuck, for example, an electrode layer through a simpler process than the conventional process, thereby providing the advantage of obtaining both the equipment performance and the price competitiveness at the same time. The electrostatic chuck manufactured by the method of the present disclosure has good durability even in a harsh application condition in which heating and cooling are repeated and can dramatically improve the efficiency of the semiconductor production process.

Hereinafter, the embodiments of the present disclosure will be described in more detail by way of examples.

Examples disclosed in the present disclosure can be modified into various other forms, and the scope of the present disclosure is not construed as being limited to the examples described below. Examples are provided to more fully describe the present disclosure to the ordinarily skilled in the art.

Example 1

Carbon nanotubes (manufactured by OCSiAl headquartered in Luxembourg) having a purity of 99.5%, a diameter of 10 nm or less, and a length of 30 μm or less were used. Aluminum powder (manufactured by MetalPlayer headquartered in Korea) having an average particle size of 45 μm and a purity of 99.8% was used.

A multilayer billet was manufactured through the steps: a third billet having a circular columnar shape was positioned at the center of a metal can serving as a first billet; and a second billet (composite powder) was positioned between the first billet and the third billet.

The second billet includes aluminum-CNT composite powder containing 0.5% by volume of the carbon nanotubes and 99.5% by volume of the aluminum powder. The first billet was made of aluminum 6063, and the third billet was made of aluminum 3003 alloy.

The second billet was manufactured in a manner described below. 99.5% by volume of the aluminum powder and 0.5% by volume of the carbon nanotubes were introduced into a stainless steel container to fill 30% of the total volume of the stainless steel container. Stainless steel balls (a mixture of balls having a diameter of 20 mm and balls having a diameter of 10 mm) were introduced into the container by 30% of the total volume of the container, and 50 mL of heptane was added to the content in the stainless steel container. The mixture was ball-milled at a low speed of 250 rpm for 24 hours in a horizontal ball mill. Next, the container was opened to allow the heptane to completely volatilize, and the remaining aluminum-CNT composite powder was collected.

The prepared aluminum-CNT composite powder was charged into the gap 2.5 t between the first billet and the third billet, and the composite powder was compressed at a pressure of 100 MPa to prepare a multi-layer billet, followed by extrusion. The extrusion performed under conditions of an extrusion ratio of 100, an extrusion rate of 5 mm/s, an extrusion pressure of 200 kg/cm$^2$, and a billet temperature of 460° C. As a result, a plate-shaped clad was obtained. This clad was then processed into a circular shape to prepare an electrode layer.

The surface of the electrode layer was then threated by blasting, and a dielectric layer having a thickness of 110 μm was formed on the entire blast-treated surface of the electrode layer by air plasma spraying (APS) using $Al_2O_3$ powder.

Example 2

An electrostatic chuck was manufactured in the same manner as in Example 1, except that the aluminum-CNT composite powder included in the second billet was changed to an aluminum-CNT composite powder (Al—1.0 vol % CNT) containing 99.0% by volume of the aluminum powder and 1.0% by volume of the carbon nanotubes.

Example 3

An electrostatic chuck was manufactured in the same manner as in Example 1, except that the aluminum-CNT composite powder included in the second billet was changed to an aluminum-CNT composite powder (Al—3.0 vol % CNT) containing 97.0% by volume of the aluminum powder and 3.0% by volume of the carbon nanotubes.

Example 4

An electrostatic chuck was manufactured in the same manner as in Example 1, except that the aluminum-CNT composite powder included in the second billet was changed to an aluminum-CNT composite powder (Al—5.0 vol % CNT) containing 95.0% by volume of the aluminum powder and 5.0% by volume of the carbon nanotubes.

Example 5

An electrostatic chuck was manufactured in the same manner as in Example 1, except that the composite powder included in the second billet was changed to an aluminum-graphene composite powder (Al—0.5 vol % Graphene) containing 99.5% by volume of the aluminum powder and 0.5% by volume of graphene.

Example 6

An electrostatic chuck was manufactured in the same manner as in Example 1, except that the composite powder included in the second billet was changed to an aluminum-graphene composite powder (Al—1.0 vol % Graphene) containing 99.0% by volume of the aluminum powder and 1.0% by volume of graphene.

Example 7

An electrostatic chuck was manufactured in the same manner as in Example 1, except that the composite powder included in the second billet was changed to an aluminum-graphene composite powder (Al—3.0 vol % Graphene) containing 97.0% by volume of the aluminum powder and 3.0% by volume of graphene.

Example 8

An electrostatic chuck was manufactured in the same manner as in Example 1, except that the composite powder included in the second billet was changed to an aluminum-graphene composite powder (Al—5.0 vol % Graphene) containing 95.0% by volume of the aluminum powder and 5.0% by volume of graphene.

Example 9

An electrostatic chuck was manufactured in the same manner as in Example 1, except that the composite powder included in the second billet was changed to an aluminum-CNT-graphene composite powder (Al—0.25 vol % CNT-0.25 vol % Graphene) containing 99.5% by volume of the aluminum powder, 0.25% by volume of the carbon nanotubes, and 0.25% by volume of graphene.

Example 10

An electrostatic chuck was manufactured in the same manner as in Example 1, except that the composite powder included in the second billet was changed to an aluminum-CNT-graphene composite powder (Al—0.5 vol % CNT-0.5 vol % Graphene) containing 99.0% by volume of the aluminum powder, 0.5% by volume of the carbon nanotubes, and 0.5% by volume of graphene.

Example 11

An electrostatic chuck was manufactured in the same manner as in Example 1, except that the composite powder included in the second billet was changed to an aluminum-CNT-graphene composite powder (Al—1.5 vol % CNT-1.5 vol % Graphene) containing 97.0% by volume of the aluminum powder, 1.5% by volume of the carbon nanotubes, and 1.5% by volume of graphene.

Example 12

An electrostatic chuck was manufactured in the same manner as in Example 1, except that the composite powder included in the second billet was changed to an aluminum-CNT-graphene composite powder (Al—2.5 vol % CNT-2.5 vol % Graphene) containing 95.0% by volume of the aluminum powder, 2.5% by volume of the carbon nanotubes, and 2.5% by volume of graphene.

The clad member containing the aluminum alloy-CNT composite material prepared as a material for an electrode layer in each of Examples 1 to 12 exhibits a maximum thermal conductivity of 290 W/m-K which is dramatically higher than that of pure aluminum, which is a conventional material for an electrode layer of an electrostatic chuck. In addition, the clad member prepared in each of Examples 1 to 12 was improved by 300% in tensile strength and 20% in elongation compared to pure aluminum, and the coefficient of thermal expansion of the clad member was $17 \times 10^{-6} K^{-1}$, which was significantly reduced compared to pure aluminum.

While exemplary embodiments of the present disclosure have been described with reference to the accompanying drawings, those skilled in the art will appreciate that the present disclosure can be implemented in other different forms without departing from the technical spirit or essential characteristics of the exemplary embodiments. Therefore, it can be understood that the exemplary embodiments described above are only for illustrative purposes and are not restrictive in all aspects.

What is claimed is:

1. A method of manufacturing an electrostatic chuck, the method comprising:
   preparing a powdered composite material by ball-milling (i) aluminum or aluminum alloy powder and (ii) carbon-based material powder;
   preparing a multilayer billet comprising the powdered composite material, wherein the multilayer billet comprises an innermost core layer and at least one shell layer surrounding the innermost core layer;
   forming an electrode layer from the multilayer billet;
   forming a metal layer at least partially over the electrode layer, the metal layer comprising 1% to 5% by weight of cobalt (Co), 10% to 20% by weight of nickel (Ni), and 75% to 85% by weight of iron (Fe); and
   forming a dielectric layer at least partially over the electrode layer and the metal layer.

2. The method according to claim 1, wherein the carbon-based material powder is at least one selected from the group consisting of carbon nanotubes, graphene, carbon nanofibers, carbon nanoparticles, mesoporous carbon, carbon nanosheets, carbon nanorods, and carbon nanobelts.

3. The method according to claim 1, wherein at least one shell layer comprises two or more shell layers, wherein the innermost core layer comprises a first powdered composite material, and
wherein at least one layer of the two or more shell layers comprises a second powdered composite material different from the first powdered composite material.

4. The method according to claim 3, wherein preparing the multilayer billet comprises:
providing a can-shaped first billet serving as a second shell layer of the two or more shell layers;
providing a second billet disposed inside the can-shaped first billet serving as a first shell layer of the two or more shell layers; and
providing a third billet disposed inside the second billet serving as the innermost core layer.

5. The method according to claim 1, wherein the multilayer billet is subjected to direct extrusion using extrusion dies to form the electrode layer.

6. The method according to claim 1, wherein the dielectric layer is made of $Al_2O_3$, $ZrO_3$, AlN, or $Y_2O_3$ and formed by thermal spraying.

7. The method according to claim 6, wherein the thermal spraying is air plasma spraying (APS), vacuum plasma spraying (VPS), or low pressure plasma spraying (LPPS).

8. The method according to claim 1, wherein a thermal conductivity of the electrode layer is greater than that of a pure aluminum and smaller than 290 W/m-K.

9. The method according to claim 1, wherein a tensile strength of the electrode layer is greater than that of a pure aluminum.

10. The method according to claim 9, wherein the tensile strength of the electrode layer is at least 300% greater than that of the pure aluminum.

11. The method according to claim 1, wherein an elongation of the electrode layer is more than that of a pure aluminum.

12. The method according to claim 11, wherein the elongation of the electrode layer is at least 20% more than that of the pure aluminum.

13. The method according to claim 1, wherein a coefficient of thermal expansion of the electrode layer is smaller than that of a pure aluminum.

14. The method according to claim 13, wherein the coefficient of thermal expansion of the electrode layer is $17 \times 10^{-6}$ $K^{-1}$.

* * * * *